Figure 1:
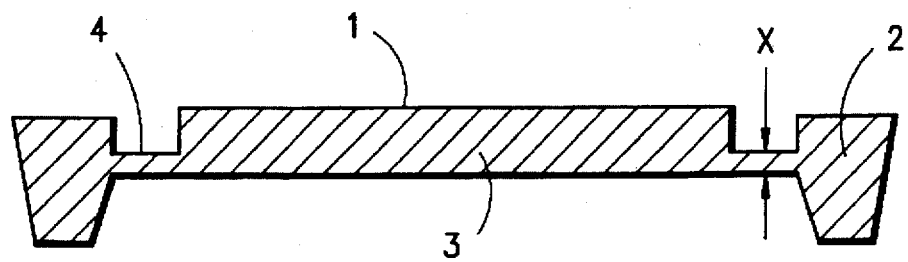

United States Patent [19]
Barak et al.

[11] Patent Number: 5,681,356
[45] Date of Patent: Oct. 28, 1997

[54] METHOD AND APPARATUS FOR PRODUCING A PLASTIC MOLDED CHIP CARD HAVING REDUCED WALL THICKNESS

[75] Inventors: Renee-Lucia Barak, Unterhaching; Yahya Haghiri-Tehrani, München; Helmut Baader, Nabburg, all of Germany

[73] Assignee: GAO Gesellschaft fur Automation und Organisation mbH, Germany

[21] Appl. No.: 146,087

[22] PCT Filed: May 7, 1992

[86] PCT No.: PCT/EP92/00991

§ 371 Date: Apr. 5, 1994

§ 102(e) Date: Apr. 5, 1994

[87] PCT Pub. No.: WO92/20506

PCT Pub. Date: Nov. 26, 1992

[30] Foreign Application Priority Data

May 10, 1991 [DE] Germany ............... 41 15 208.5
Dec. 20, 1991 [DE] Germany ............... 41 42 392.5

[51] Int. Cl.[6] ............... H01L 21/56; H01L 21/58; H01L 21/68
[52] U.S. Cl. ............... 29/25.01; 437/214; 264/328.7; 264/272.17
[58] Field of Search ............... 437/214; 29/25.01; 264/328.7, 272.17

[56] References Cited

U.S. PATENT DOCUMENTS

| | | | |
|---|---|---|---|
| 4,184,835 | 1/1980 | Talbot | 425/577 |
| 4,463,971 | 8/1984 | Hoppe et al. | 283/83 |
| 4,470,786 | 9/1984 | Sano et al. | 425/125 |
| 4,540,534 | 9/1985 | Grendol | 264/2.2 |
| 4,944,908 | 7/1990 | Leveque | 264/232 |
| 4,954,308 | 9/1990 | Yabe et al. | 264/272.17 |
| 5,030,407 | 7/1991 | Mollet et al. | 264/261 |
| 5,304,513 | 4/1994 | Haghiri-Tehrani et al. | 437/214 |
| 5,417,905 | 5/1995 | Lemaire et al. | 264/139 |

FOREIGN PATENT DOCUMENTS

| | | |
|---|---|---|
| 58-39425 | 3/1983 | Japan. |
| 59-185636 | 10/1984 | Japan. |
| 60-193347 | 10/1985 | Japan. |
| 61-68209 | 4/1986 | Japan. |
| 62-13094 | 1/1987 | Japan. |

*Primary Examiner*—David E. Graybill
*Attorney, Agent, or Firm*—Bacon & Thomas

[57] ABSTRACT

An apparatus and method for producing plastic chip cards and chip card blanks with a wall thickness considerably reduced in certain areas involves first injecting the plastic material into an initial mold space that has no reductions in wall thickness as yet. The distance between certain wall areas of the initial mold space is then reduced to the required reduced measure, displacing the plastic material into adjacent areas of the mold space.

13 Claims, 5 Drawing Sheets

METHOD AND APPARATUS FOR PRODUCING A PLASTIC MOLDED CHIP CARD HAVING REDUCED WALL THICKNESS

The present invention relates to a method and apparatus for producing chip cards and chip card blanks whose wall thickness is reduced in certain areas by injecting a molten plastic material into a mold space and then cooling the plastic material.

EP 0 277 854 A1 and EP 0 267 826 A1 disclose chip cards or chip card blanks having a membrane area or depression for taking up the chip module and made by injection molding.

In the card production method presented in EP 0 277 854 A1 the module is already located in the casting mold during the injection process, being held there by suction air. A plate spring-mounted in the cavity of the casting mold for pressing the module against the upper casting mold ensures an additional positioning and fixation of the module prior to injection molding. The plastic is injected via a side edge of the mold whereby the plate is lowered to card thickness due to the arising pressure.

This method permits production of a chip card in one operation. Since the module is located in the mold space during the injection process, however, it acts like a die protruding into the casting mold. Due to the lateral injection of the material the plastic stream divides into two streams before the module or before a die, flowing around the obstacle and reuniting behind it. This gives rise to a preferred molecular orientation in the direction of flow behind the obstacle in the mold space, which might result in predetermined breaking points. Furthermore the direction of flow defined by the lateral injection channel does not permit the formation of complex, sharp contours in the area of the membrane as are necessary for example for forming anchoring elements for the module. Finally voids can form due to inclusions of air in the membrane area upon lateral injection.

EP 0 267 826 A1 presents a method for producing chip card blanks by injection molding. The casting mold used is formed from plane-parallel plates that are mutually movable. The injection channel is provided in one of the plates. Disposed opposite in the other plate is a die protruding into the casting mold and provided with cooling ducts to mold the recess for taking up the chip module in the card later. The die has depressions on its face to produce knobs in the bottom of the module recess. When the chip module is introduced into the recess it lies on the knobs so that the gap between the chip module and the bottom can be filled with an adhesive for fastening the module.

The method presented in EP 0 267 826 A1 eliminates the disadvantages of the method stated in EP 0 277 254 A1 due to the position of the injection channel. In particular, no preferred break points arise and complex, sharp contours (knobs) can be formed in the area of the face of the die. Due to the position of the injection channel, however, the inevitable injection nipple is located in the area of the membrane on the back of the card blank, which impairs the visual appearance of the finished card. An even more serious problem is that the plastic material is first injected into the area with reduced wall thickness and then flows into the other areas with a considerable pressure loss. There is therefore a danger of the peripheral areas of the mold space being incompletely filled with plastic material.

Summing up it can be said that both methods permit inexpensive production of chip cards or chip card blanks but involve quality losses.

The present invention is thus based on the problem of providing a method and apparatus of the above species to permit economical production of chip cards and chip card blanks whose wall thickness is considerably reduced in certain areas, without the described restrictions.

This problem is solved according to the invention by the features stated in the characterizing part of the main claim.

In the inventive method the plastic material is thus first injected into an initial mold space whose configuration corresponds substantially to that of the molding without any reduced wall thickness. Since there are no reductions of area obstructing the flow path in this initial state of the mold space the latter is filled with plastic material without any problem whatsoever. There are accordingly no restrictions with respect to the usable materials.

Further, in the inventive method the distance between certain wall areas of the initial mold space corresponding to the area or areas of reduced wall thickness is reduced at a certain time so that the plastic material in these areas is displaced down to a residual wall thickness that can be many times smaller than the wall thickness in adjacent areas.

Although the distance between the certain wall areas of the mold space is generally reduced only after the initial mold space has been filled more or less completely, this method step can already take place at a time when the plastic material has filled the space between the certain wall areas but not the total initial mold space. While in the former case measures must be taken to permit the volume of material displaced by the reduction of distance to be taken up by other areas of the mold space, it is possible in the latter case to use the displaced volume of material to fill the mold space completely.

Suitable measures for compensating the displaced volume of material can be a corresponding change of volume in the mold space at places outside the certain wall areas and/or a displacement of the plastic material back into the gate system.

According to a development of the invention the movable elements of the injection mold are used not only for producing the thin wall areas but also for embedding foreign bodies in the plastic compound. As will be explained further with reference to the embodiment examples, this can be done in various ways. To illustrate the great number of possibilities two variants will be described.

In one of these embodiments a movable die is used to press a microchip module (as is usually employed for chip cards) fixed on the face of the die into the plastic compound. It is thus possible both to introduce and fix the module in the card body and to create the required cavity in one operation.

In the second embodiment the embedding of the module is divided into two steps, the cavity being created by pressing in the die in a first step and the module inserted in this cavity in a second, directly following step. The module is fixed in the cavity with the aid of a hot-melt adhesive coating provided on the module and activated by the residual heat of the injection-molded card body.

The inventive method has a great number of advantages over known possibilities. For example the face of the movable die can have a structure virtually as complicated as one pleases. By pressing the die into the plastic compound one always obtains an exact impression of these structures. The formation of voids, flaws, fuzzy contours, etc., is completely avoided.

Since the die is pressed into the plastic compound only after the latter has flowed in, the molecular orientation is uniform throughout the volume of the card, i.e. no preferred break lines due to different molecular orientation arise. Such preferred break lines must usually be expected when the plastic compound flows around mold elements inserted into the mold during injection or at the points where the various plastic streams meet after flowing around the "obstacle".

Since the thin wall areas are produced by pressing the plastic compound that has already flowed in, one obtains not only the exact form and wall thickness of even very thin membranes, but also increased strength of the plastic material in these areas due to the compression of the plastic compound. This is of special interest for chip cards since the cards are exposed to particular stresses in the subsequent printing operations (application of the printed image) and in the later use of the card.

Figure 2:
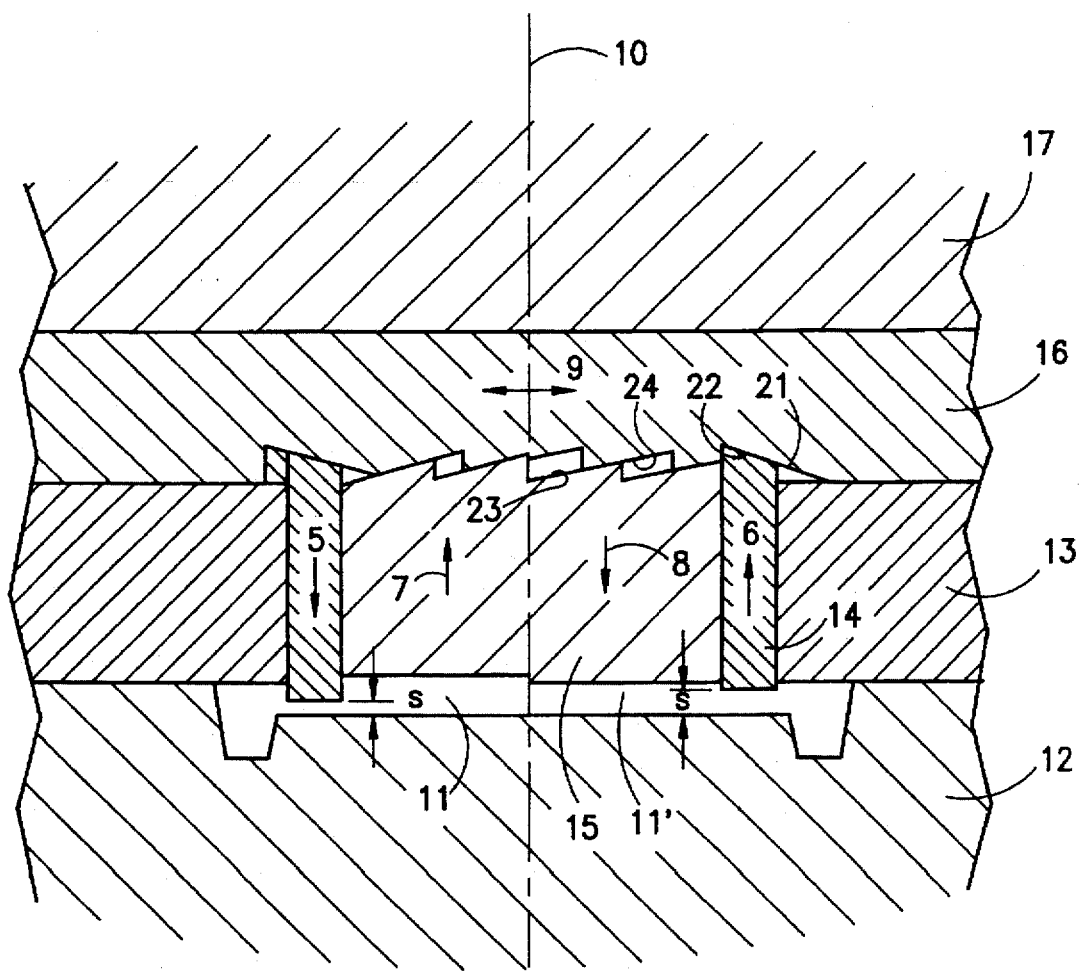
Figure 3:
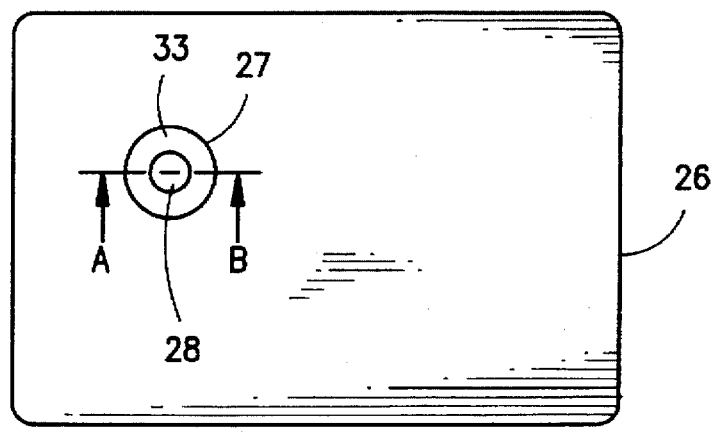
Figure 4:
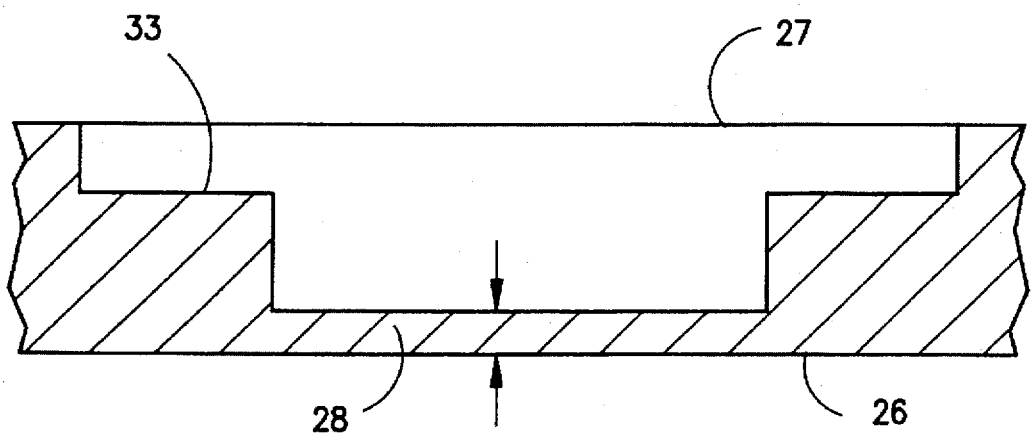
Figure 5:
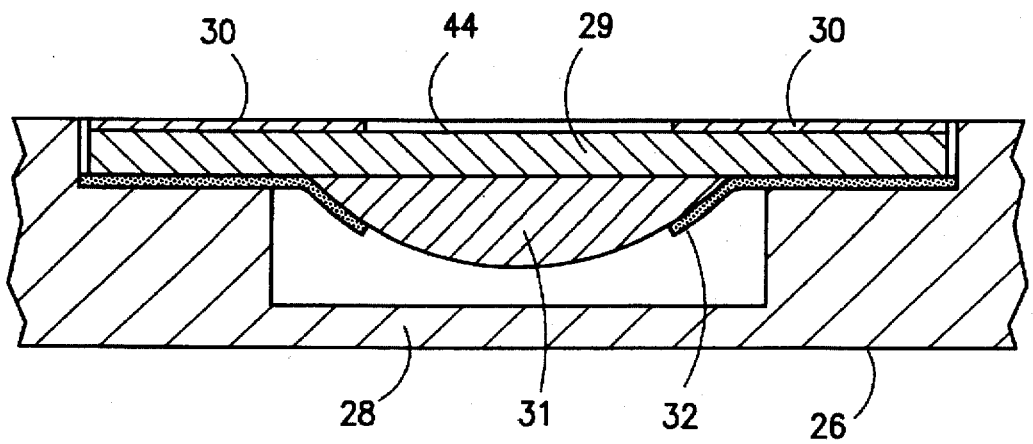
Figure 6:
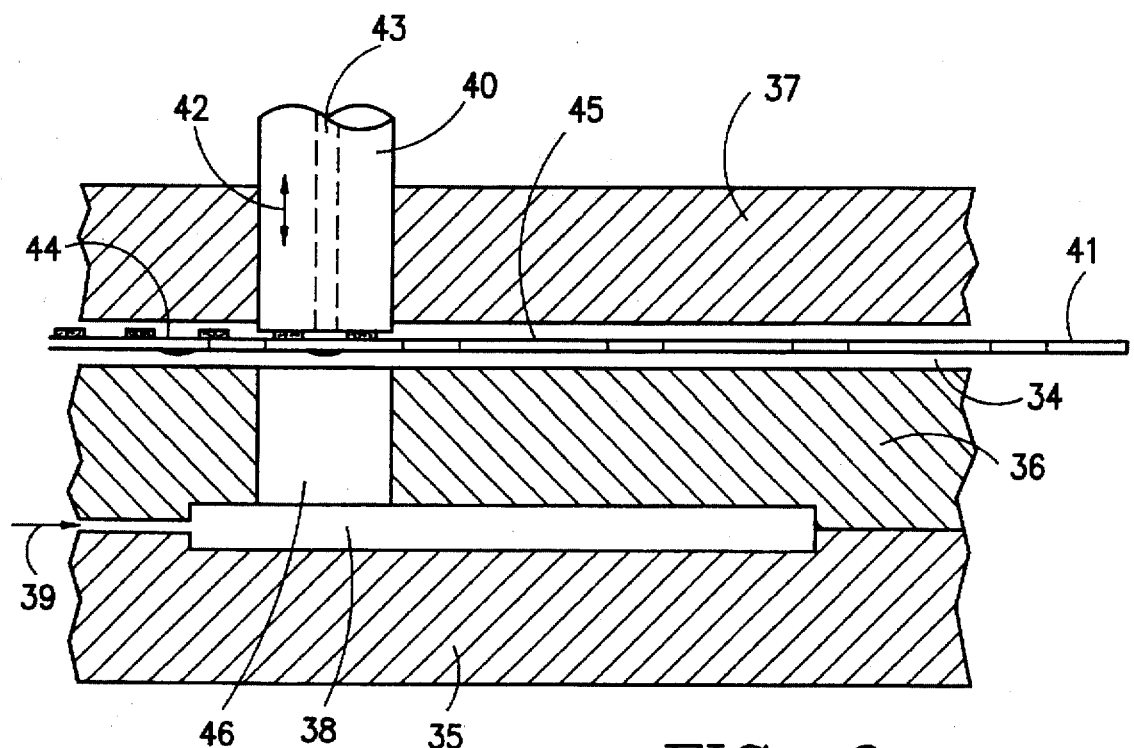
Figure 7A:
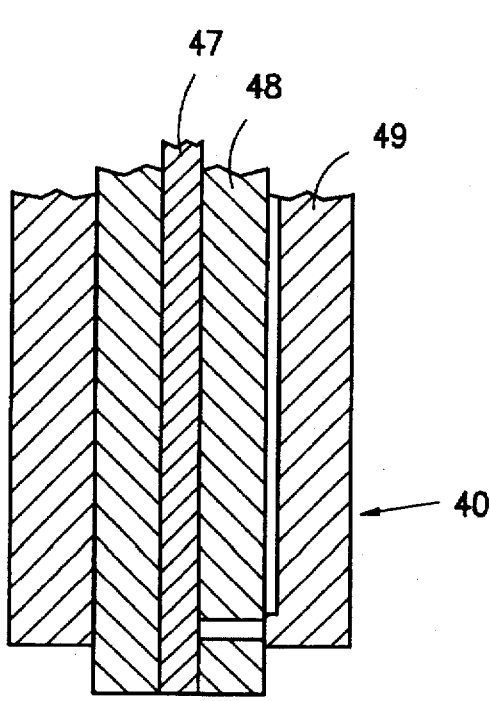
Figure 7B:
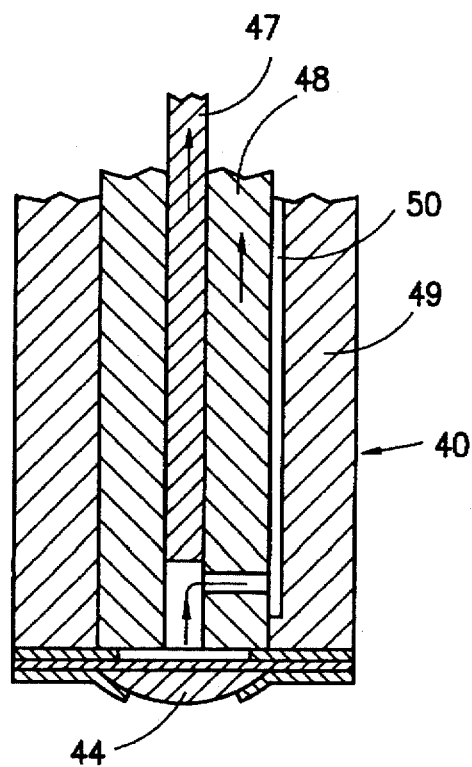
Figure 8A:
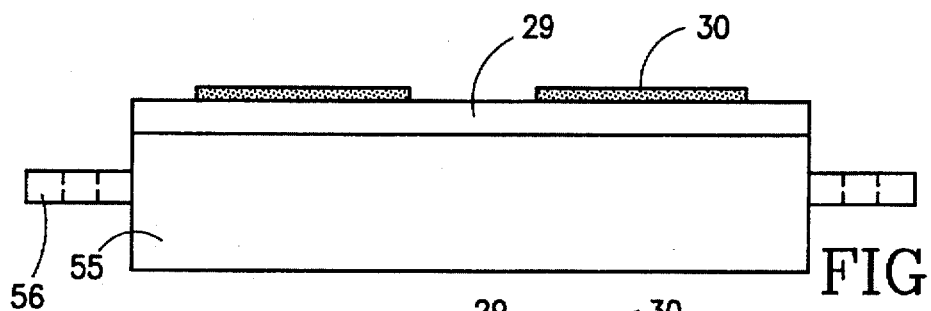
Figure 8B:
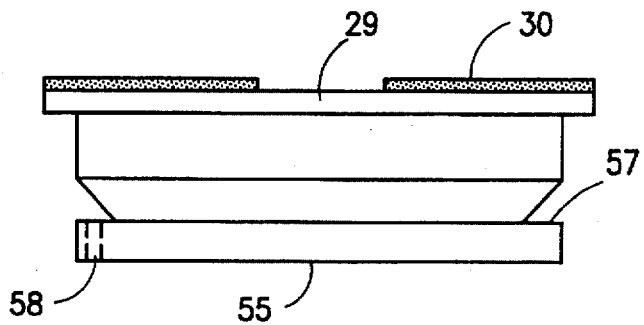
Figure 8C:
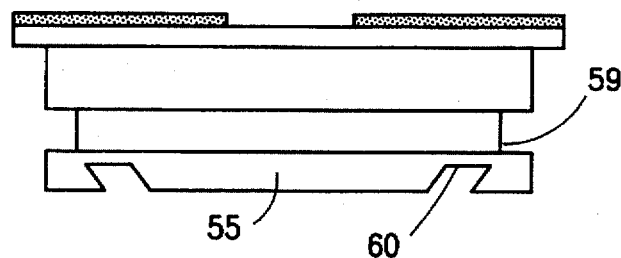
Figure 8D:
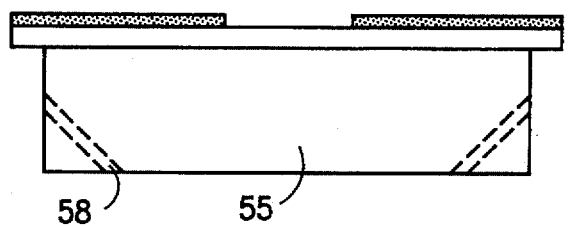
Figure 8E:
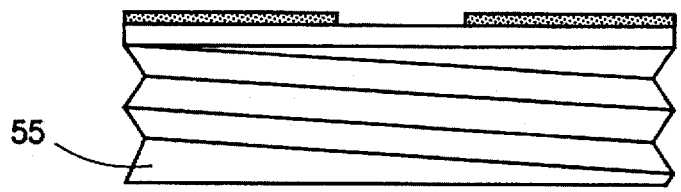
Figure 8F:
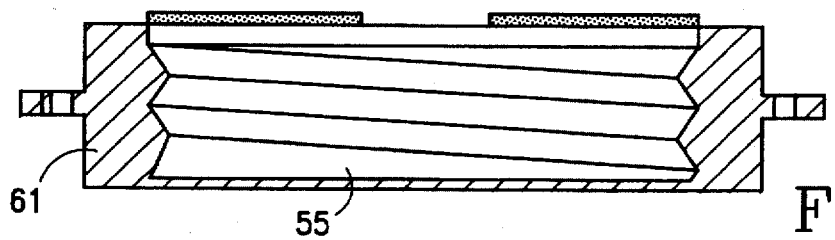
Figure 9:
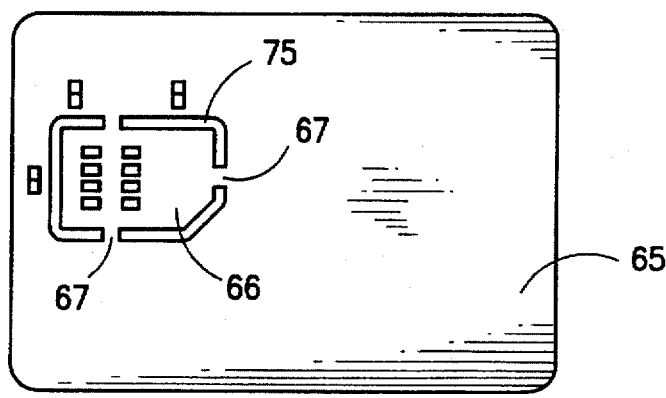
Figure 10:
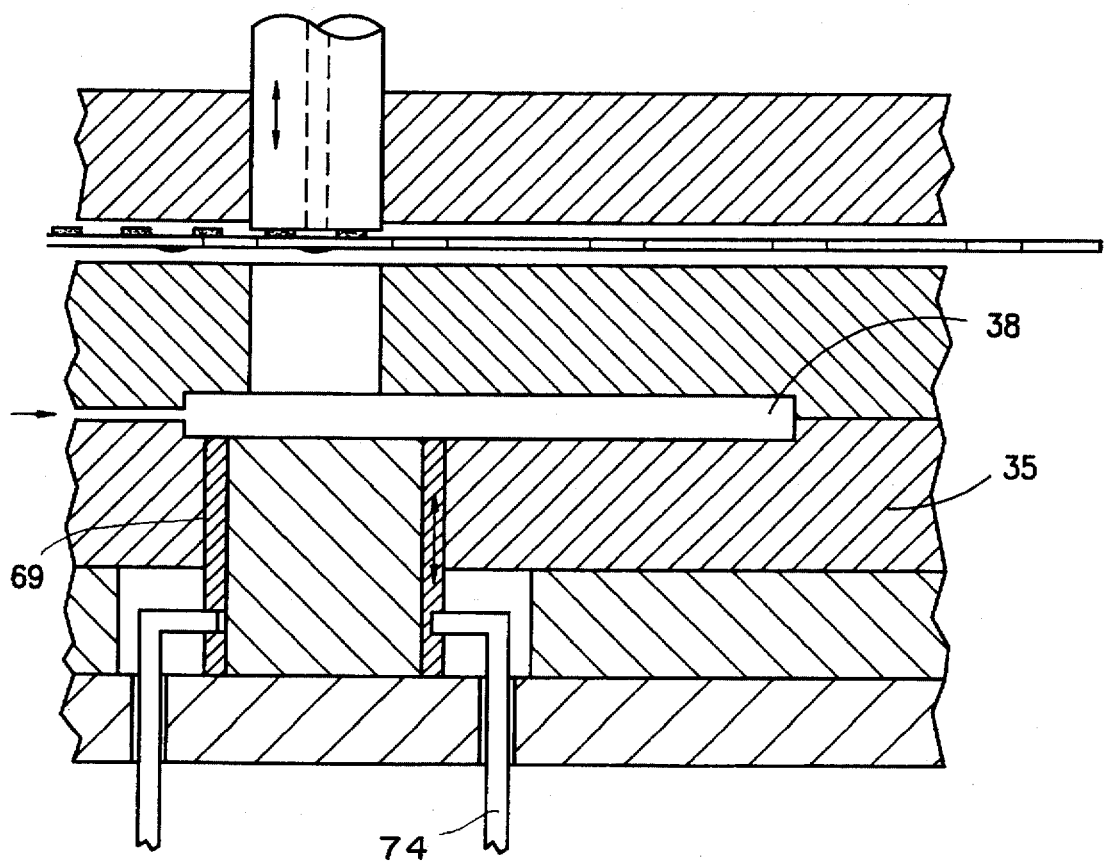

Further advantages and variants are found in the following examples to be described with reference to the drawing, in which FIG. 1 shows a sectional drawing of a rotationally symmetrical membrane with different wall thickness areas, FIG. 2 shows an injection mold in a fragmentary sectional view in positions at the time of mold filling and the reduction of wall thickness, FIG. 3 shows a chip card blank from the front, FIG. 4 shows section A–B from FIG. 3, FIG. 5 shows section A–B with an inserted chip module, FIG. 6 shows an apparatus for producing injection molded cards in a simplified sectional view, FIGS. 7a and 7b show alternative apparatus elements for producing injection-molded cards, FIGS. 8a–f show alternative chip modules for advantageous incorporation in injection-molded cards, FIG. 9 shows a standard card with an integrated mini chip card from the front, FIG. 10 shows an apparatus for producing standard cards with integrated mini chip cards in a simplified sectional view.

To illustrate the basic principle utilized according to the invention FIG. 1 shows a sectional view of plastic molding 1 with different wall thicknesses. Molding 1 is of rotationally symmetrical design. It has outer ring 2 which is reinforced and profiled so that it can be fastened in a ring-shaped housing groove in later application. Inside molding 1 there is circular bottom or membrane 3 with increased wall thickness. Between outer ring 2 and membrane 3 there is ring-shaped reduced wall thickness 4 causing an elastic embedding of membrane 3.

FIG. 2 shows schematically an injection mold for producing molding 1 sketched in FIG. 1.

The injection mold shown includes in the known way first mold part or molding plate 12 and second mold part or molding plate 13 that can be shifted along center line 10 with the aid of apparatus elements (not shown) to open the mold. In the closed position shown, mold parts 12, 13 define mold space 11, 11' between each other. Although mold space 11, 11' is rotationally symmetrical to center line 10 in the embodiment shown, the invention is of course not limited to such a position of the mold space. Other, asymmetrical assemblies can also be provided.

One of mold parts 12, 13—mold part 13 in the present embodiment—contains an assembly comprising outer core element 14 and inner die element 15. Elements 14, 15 can be moved relative to each other and to mold part 13 and have free faces limiting or defining mold space 11 in certain areas.

As already mentioned, the injection mold serves in the present embodiment to produce a disk-shaped molding with a ring-shaped reduction of area near its outer periphery. Outer core element 14 can accordingly have a cylindrical configuration with a axis coinciding with center line 10 of mold space 11.

As indicated by arrows 5, 6, outer core element 14 is movable relative to opposite mold part 12 between first and second positions each stop-limited by suitable means not shown. In the initial position (on the right in the drawing), distance "S" between the free face of core element 14 and an opposite wall area of mold space 11 is relatively great since core element 14 is substantially sunk in mold part 13. In the area of core element 14 there is thus no cross-sectional constriction to prevent the material from flowing in from a central gate point (not shown) to the outer limits of mold space 11. In this position of core element 14 mold space 11 has a configuration corresponding substantially to that of the molding to be produced without any reduced wall thickness and will therefore be referred to as "initial mold space 11'" in the following.

In the second position shown on the left in the drawing, core element 14 has been shifted into mold space 11 thereby reducing the distance between its free face and the opposite wall area of mold space 11 to a dimension "s". This dimension "s" corresponds to the desired reduced wall thickness on the molding to be produced.

Although other suitable means can be provided, the motion of core element 14 between the first and second positions is controlled in the present embodiment by an assembly of cooperating first wedge surfaces 21, 22 on the face of core element 14 facing away from mold space 11 and on a control element 16 disposed displaceably between mold part 13 and support plate 17, respectively. Wedge surfaces 21, 22 cause the translational reciprocating motion of control element 16 (cf. arrow 9) to be converted into a motion of core element 14 in the direction of arrow 5 or 6. Obviously other suitable means, e.g. a solenoid or hydraulic piston/cylinder means, can also be provided for this purpose.

The motion of control element 16 in the direction of arrow 9 can be effected by any suitable operating means (not shown), e.g. piston-cylinder means, in accordance with the command from a control means (not shown either).

The arrangement of cooperating first wedge surfaces 21, 22 is such that upon motion of control element 16 in one direction (to the right in the drawing) core element 14 assumes the first or starting position, while upon motion of control element 16 in the opposite direction core element 14 is brought into the second position on the left in the drawing.

A second pair of cooperating wedge surfaces 23, 24 is provided on inner die element 15 and control element 16, respectively. Second wedge surfaces 23, 24 are of opposite orientation in relation to first wedge surfaces 21, 22 so that the motion of control element 16 in one direction triggers a motion of die element 15 in a direction opposite that of core element 14. Upon a shift of control element 16 to the left in the drawing die element 5 therefore undergoes motion in the direction of arrow 7 away from opposite mold part 12, so that the distance between the free face of die element 15 and the opposite wall area of mold space 11 is somewhat increased while the distance between the free face of core element 14 and the opposite wall area of mold space 11 is simultaneously reduced.

By suitably coordinating the inclination of first and second wedge surfaces 21, 22 and 23, 24 one can make the volume increase of mold space 11 obtained by the motion of die element 15 correspond substantially to the volume decrease due to the motion of core element 14 into the second position. This makes it possible to change the total volume of mold space 11 substantially both in the first and in the second position of core element 14. However the invention is obviously not limited to a virtually complete volume compensation. Instead the partial volumes displaced or created by elements 14, 15 can differ from each other, if desired, so that special effects can be obtained on the molding to be produced, e.g. a compression of material.

The above-described apparatus functions as follows. Molten plastic material is injected into initial mold space 11' via the central gate system not shown in the drawing, whereby core element 14 and die element 15 are located in the positions on the right in the drawing so that the material can flow to the outer areas of initial mold space 11' through large gap "S" without any substantial obstruction, thereby ensuring its unproblematic complete filling. Immediately after the end of the filling process the control means gives a command to the operating means of control element 16 so that control element 16 is moved in a direction to the left in the drawing along arrow 9. The motion of control element 16 causes core element 14 to be brought in the direction of arrow 5 into the second position on the left in the drawing, thereby displacing the material located between its face and the opposite wall of mold space 11. Simultaneously the shift of control element 16 causes a motion of inner die element 15 in a direction along arrow 7 away from opposite mold part 12 so that the distance between its free face and the opposite wall of mold space 11 is somewhat increased to take up the volume displaced by core element 14.

The position of the parts shown on the left of the drawing is maintained until the material in mold space 11 has cooled and the mold has been opened by suitable mechanical or pneumatic means to eject the obtained molding from the mold space. A wall thickness corresponding to gap "s", which if desired can be many times smaller than the wall thickness on adjacent areas of the molding, then remains in the latter in the range of action of outer core element 14. Experiments have shown that the inventive method readily permits a reduction from an initial wall thickness of e.g. 0.8 mm to 0.15 mm or less without joint lines or inclusions of air occurring on the produced moldings. Since the mold filling process is not restricted by any cross-sectional constriction of the mold space, virtually all thermoplastic synthetic materials can be processed by the inventive method. The relevant restrictions in conventional methods for injection molding thin wall thicknesses no longer exist.

Obviously the invention is not limited to the shown number of core and die elements 14, 15 and their arrangement relative to each other and to mold space 11; one can provide any desired assembly of one or more core elements 14 reducing wall thickness with one or more die elements 15. The volume can be changed not by die element 15 but by guiding the volume of material displaced by core element 14 back into the gate system through the as yet plastic core of the material in the mold space. Other means can likewise be provided for producing a change in volume, e.g. membranous elasticity of a wall area of the mold space.

In the embodiment shown, elements 14, 15 move substantially parallel to each other and to center line 10. The invention is not limited to such a direction of motion. The motions of the individual elements between their particular end positions can instead be adapted to the particular case of application and aligned differently.

FIG. 3 shows chip card blank 26 that can be produced in a particularly advantageous way by the inventive method. Card blank 26 has depression 27 with steps 28 and 33 into which a chip module will be inserted at a later time.

FIG. 4 shows schematically section A–B of FIG. 3. For the sake of clarity the true proportions are not shown. The outer dimensions of such chip cards are usually about 85 mm×54 mm, the thickness 0.76 mm, membrane 28 on the bottom of depression 27 has a wall thickness of about 100 μm. The outer diameter of depression 27 is about 15 to 20 mm, the shape of the depression can vary as desired with respect to both the outer contour and the stepping. For example, rectangular, square or oval outer contours are known. The depression itself can also have several steps or be of lenticular form in the inner area.

FIG. 5 shows section A–B of the card area with inserted chip module 44. The chip module comprises carrier foil 29 provided with metallic contact surfaces 30 permitting communication with the integrated circuit—or "chip" (not shown)—disposed within casting resin pellet 31 during use of chip card 26. Chip module 44 is provided with adhesive layer 32 for fixing the module in recess 27.

FIG. 6 shows an injection mold for producing chip cards utilizing the inventive method. The apparatus comprises substantially lower mold part 35 and upper mold part 36. Between these two mold parts there is mold space 38 that has the form of the later chip card but without depression 27 shown in FIG. 4. Mold parts 35 and 36 have injection channel 39 through which the plastic material flows into the mold. Die guide means 46 is also provided for introducing die 40 into mold space 38.

In the simplest case card 26 could be injection molded by introducing die 40 into die guide means 46 until the face of the die is flush with the edge of mold space 38. With this arrangement the plastic material is pressed in through injection channel 39 in a first step. When the mold space has been largely filled with plastic material die 40 is pressed into the mold space, or the plastic compound located therein, until the face of die 40 is reproduced in the plastic compound, or stepped depression 27 produced. The plastic material displaced by die 40 is, as already described, either displaced into the mold space not yet completely filled with plastic material or pressed back into injection channel 39. After the injection operation and sufficient cooling of the plastic compound, mold parts 35 and 36 are opened and molding or chip card blank 26 removed from the mold. The removal can be mechanically supported by lowering die 40 further instead of using a specially provided ejector.

When carrying out this method it is of course necessary to form the face of die 40 departing from the embodiment shown in FIG. 6 in accordance with depression 27. That is, the face must have a step as shown in FIG. 7a for forming membrane 28. The form of the die itself corresponds to the broadened area of the depression or the outer contour shape of recess 27.

One can of course selectively influence not only the face of the die but also its surface, for example to produce special surface roughnesses of ring-shaped step 33 in the later chip card blank, as necessary in the present case. By selectively roughening this surface one obtains better adhesion of adhesive 32 during assembly of the chip module.

The apparatus shown in FIG. 6 has further apparatus elements that permit not only the production of the above-described chip card blank but also the simultaneous embedding of the chip module.

Upper mold part 36 is accordingly supplemented by further guide plate 37 that likewise has die guide means 46. Die 40 can thus be pressed into the mold space through guide plate 37 and upper mold part 36. Between upper mold part 36 and guide plate 37 there is transport channel 34 which crosses die guide means 46 and permits foil strip 41 to be transported past the face of die 40. Foil strip 41 is designed as an "endless band" and contains a row of chip modules 44.

As a modification of the simplest variant initially described, die 40 shown in FIG. 6 has no stepping but a plane surface. One or more suction air ducts 43 are also provided for sucking the foil strip onto the face of the die.

The card is produced as follows.

In a first step foil strip 41 is disposed before the face of die 40 in such a way that a chip card module 44 is positioned therebefore. By lowering die 40 toward mold space 38 (arrow 42) one urges the chip module into the die guide means of mold part 36 and stamps it out of foil strip 41. The stamped out chip module is sucked via air ducts 43 and thus held on the face of the die. Die 40 is now lowered toward mold space 38 until the lower edge of the chip module is substantially flush with the upper edge of mold space 38, i.e. the chip module does not yet protrude into the mold space. In this position the plastic material is injected via injection channel 39. After sufficient filling of the mold space the die together with the chip module is pressed into the plastic compound until the plane face of die 40 is flush with the later card surface.

After sufficient cooling of the plastic compound the mold is opened, i.e. mold parts 35 and 36 moved apart, and the molding ejected from the mold by reactivation of die 40. The card is separated from the plastic compound located in injection channel 39 in the known way by either tearing or cutting it off with cutting elements not shown.

After mold parts 35 and 36 are closed die 40 is withdrawn to the starting position and the area of the foil strip provided with stamping 45 moved on until another chip module 44 is positioned before die 40.

The card production method shown in FIG. 6 thus permits the production of injection-molded chip cards with simultaneous embedding of the chip module. The pressing of the chip module into the injected plastic compound is relatively unproblematic, as experiments have shown, as long as the outer form of the chip module is of simple structure and the module mechanically stressable. With elaborately structured modules or large chip modules (such as microprocessor chips) it may be advisable to create the cavity in the card before embedding the module. This is done in a simple way by modifying the procedure described for FIG. 6 and using die 40 for performing these additional functions.

FIG. 7a shows a possible embodiment of die 40 accordingly equipped with additional functions. Die 40 comprises three die elements 47, 48 and 49 sliding into one another. Die 40 is used in the form shown in FIG. 7a for pressing in depression 27. For this purpose the die is brought to mold space 38 through stamping 45 in foil strip 41, the plastic material injected into the mold space and, as described above, pressed into the molding material.

After stepped depression 27 has been embossed in the card body die 40 is withdrawn into guide plate 37. Also, die element 48 is moved back until the face of element 48 is flush with the face of element 49. In addition, pin 47 is withdrawn into the position shown in FIG. 7b and fixed. In this position there results an air duct opening into the center of the face of the die and permitting chip module 44 to be sucked against it through a bore in element 48 and longitudinal groove 50 provided in element 49.

After die 40 has been brought into the arrangement shown in FIG. 7b by withdrawal of elements 47 and 48 and foil strip 41 has moved on one position, die 40 is urged toward the mold space again whereby it stamps chip module 44 out of foil strip 41 and places it in the stepped depression previously created, as described above. Chip module 44 equipped with adhesive layer 32 is now pressed with die 40 into recess 27. The residual heat of the plastic material activates the hot-melt adhesive and fixes the module in the card body.

After sufficient cooling mold parts 35 and 36 can be opened again and the card body removed from the mold.

Chip modules with anchoring elements for anchoring the module in the card body additionally or alternatively to an adhesive layer are particularly suitable for incorporation in injection-molded cards.

Such a module is already known from DE 31 31 216 C2 and shown in FIG. 8a. For simplicity's sake only the components necessary for describing the situation are shown here, just as in the following figures. The chip module comprises carrier foil 29 bearing contact surfaces 30 which are electrically connected with the chip. To be protected from mechanical stresses the chip module and electric connections are surrounded by cast body 55. Anchoring elements 56 protrude beyond the edge of cast body 55, serving solely to anchor the module in the card body. For this purpose anchoring element 56 can be formed for example as a perforated ring to be embedded in the card material. The holes are penetrated by the card material so as to ensure an anchoring of the chip module in the card.

Furthermore, for cards produced by injection molding one can also use chip modules whose anchoring elements do not protrude beyond the cast body but are provided in the cast body itself through a special design, such as recesses, depressions, bores, etc. Such embodiments are shown in FIGS. 8b to 8e.

During production of the injection-molded cards such modules can either be first introduced into the mold space and then injection molded around or subsequently pressed into the as yet unsolidified plastic compound. Recesses, notches, bores, profiles, etc., disposed in the direction of flow of the material are thereby filled particularly well with plastic material.

With the module shown in FIG. 8b a ring-shaped depression is set in cast body 55. The wedge shape of this depression favors complete filling with plastic material, on the one hand, while ensuring optimal anchoring of the module even during bending of the chip card, on the other hand.

FIG. 8c shows a chip module with recesses both in the surface area and in the end face of the cast body. Recess 59 in the surface area is ring-shaped and prevents the chip module from being removed from the card body. Bent recesses 60 anchor the module additionally in the card body but also prevent the module from rotating in the card.

FIG. 8d shows a chip module whose cast body 55 is penetrated by channels 58. The channels open in the bottom surface of the module, on the one hand, and in the surface area of the cast body, on the other. The channels have an inclination of about 45° for example. The chip module shown in FIG. 8d is particularly suitable if the module is to be pressed into the already injected plastic compound since the liquid plastic material also flows through channels 58 very well. To prevent the plastic material that has flowed into the bores from breaking later during use of the card the openings in the surface area are disposed so as to be positioned approximately in the middle of the card when the chip module is pressed in. The forces occurring here when the card is bent are minimal so that no damage to the anchoring need be expected from bending of the card.

FIG. 8e shows a chip module with cast body 55 whose surface area has a threaded design. The relatively complex thread structure is reproduced as an exact negative form in the as yet unsolidified plastic compound by the pressing in of the module. If the materials forming the cast body and the card body are selected so that they do not bond with each other the module anchored with the card body via the thread can later be screwed out. The inventive method thus permits production of a chip card with a replaceable module without requiring any additional method steps.

FIG. 8f shows module 55 shown in FIG. 8e in conjunction with threaded sleeve 61. The sleeve has anchoring elements 56 for fixing the sleeve in the card body. Sleeve 61 is incorporated in the card body during the injection operation either with or without screwed-in module 55. To prevent deformation of the sleeve, however, it is preferable to incorporate it together with the chip module or a corresponding dummy module.

Sleeve 61 shown in FIG. 8f is equipped with an anchoring frame as is shown in FIG. 8a. The latter protrudes beyond the edge of sleeve 61, ensuring a particularly good anchoring of the chip module/sleeve unit in the card body. In the same way one can also use other anchoring elements, e.g. those shown in FIGS. 8b to 8e. Instead of the thread one can also select another detachable connection, such as a kind of bayonet catch, for this embodiment.

FIG. 9 shows standard card 65 with integrated mini chip card 66 as known for example from DE 40 07 221 A1. As explained in DE 40 07 221 A1 such mini chip cards 66 are usually stamped out of conventional standard cards 65. However such a standard card 65 with integrated mini chip card 66 can also be produced by the inventive injection molding technique without subsequent stamping operations. For this purpose the injection mold shown in FIG. 6 should be modified for example.

FIG. 10 shows such an adapted injection mold. Its lower mold part 35 has a slit-shaped opening for introducing stamping die 69 into mold space 38. Stamping die 69 has the form of stamped gap 75 shown in standard card 65 in FIG. 9.

In the nonoperative state, i.e. the arrangement shown in FIG. 10, the effective face of stamping die 69 is flush with the surface of the mold space of lower mold part 35. Stamping die 69 is fitted into lower mold part 35 so that it can be inserted into the mold space with the aid of grippers 74 but there is no gap through which the plastic compound injected into the mold space can escape. In the face of stamping die 69 "notches" are provided at the places where connecting bars 67 are to be produced in the later card that correspond in form and size to the later connecting bars.

Standard cards with integrated mini chip cards are produced in the customary way, i.e. as explained in connection with FIGS. 6 and 7. At the end of this process stamping die 69 is pressed into the mold space with the aid of grippers 74 to produce contour 75 and bars 67. After the card material has solidified the stamping die is removed from mold space 38 with grippers 74 and the injection mold opened to remove the card.

For the sake of completeness it should be mentioned that the embodiment examples shown in the Figures are not a definitive list of possible embodiments. The expert will appreciate that it is possible to combine the various construction details or to supplement or modify them by measures known from the prior art without departing from the basic inventive principle.

We claim:

1. A method for producing chip cards comprising an injection-molded plastic card body with a recess containing a chip module, comprising the following steps:

positioning a foil strip carrying chip modules in front of and adjacent the face of a movable die of an injection mold apparatus;

drawing the foil strip and an associated chip module against the face of the die by activating a suction air source associated with the die;

advancing the die toward an initial mold space defined by mold wall areas whose configuration corresponds substantially to the card body without the recess, and simultaneously stamping a chip module out of the foil strip by the die so that the stamped chip module is affixed to the die face by the air suction;

positioning the chip module by means of the die movement at the area of a boundary surface of the initial mold space;

injecting molten plastic material into the initial mold space to form the card body;

further advancing the die so that the chip module on the die face is pressed into a surface of the injected plastic material after the mold space in the area of the die is substantially filled with plastic material;

completely filling the mold space insofar as any cavities in the mold space are left to be filled with plastic material;

cooling the plastic material until the plastic material has solidified; and opening the mold apparatus and removing the card body and chip module.

2. A method for producing chip cards comprising an injection-molded plastic card body with a recess containing a chip module, comprising the following steps:

advancing a movable die of an injection mold apparatus and having a variable configuration face conforming to a chip module receiving recess to be produced in a chip card into a boundary area of an initial mold space defined by mold wall areas whose configuration corresponds substantially to the card body without the recess;

injecting molten plastic material into the initial mold space;

further advancing the die into the plastic material in the mold space to form a recess in the injected plastic material;

further injecting the plastic material into the mold space until the mold space is filled to form the card body;

cooling the plastic material until it has solidified;

withdrawing the movable die to a waiting position at which a foil strip carrying chip modules may be positioned in front of and adjacent the face of the die;

changing the face of the die into a form suitable for stamping out a chip module, fixing the stamped chip module to the die face, and inserting the chip module into the recess in the plastic material;

positioning a foil strip carrying chip modules in front of and adjacent the die face;

drawing to and affixing the chip module against the face of the die;

advancing the die again while stamping out a chip module from the foil strip until the chip module is inserted and pressed into the recess in the molded plastic material; and opening the mold apparatus and removing the card body with the chip module in the recess.

3. The method of claim 1 or 2, wherein the movable die is advanced into the initial mold space only after the latter has been filled virtually completely with plastic material.

4. The method of claim 3 wherein wall distances defining the initial mold space are increased in certain areas of the mold space while the movable die is advanced to reduce the mold space in the area of the recess, the area where the wall distances increase being arranged to receive plastic material displaced out of the mold space in areas that are reduced.

5. The method of claim 4 wherein the plastic material is displaced into a gate system for the mold when the die is advanced into the initial mold space.

6. The method of claim 1 or 2, wherein the plastic material displaced by advancement of the movable die into the initial mold space is accommodated during the injection of molten plastic material into the mold space.

7. The method of any one of claim 1 or 2, wherein the chip module has a hot-melt adhesive coating, including the step of activating the coating by the residual heat of the molded plastic material after the chip module has been placed in the recess.

8. A method according to claim 1 or 2, wherein the chip cards comprise mini-chip cards integrated in a standard card that is connected via links with the surrounding card body of the standard card, including the step of producing the outer shade of the mini-chip card by pressing a stamping die into a plastic material disposed in the initial mold space.

9. An injection molding apparatus for producing plastic chip cards with chip modules in recesses in the cards, the molding apparatus comprising:
   a mold space defined at least in part by mold wall areas and at least one die having a virtually flat die face movable between first and second positions within and outside of the mold space, respectively;
   said mold space corresponding virtually to the shape of a chip card without recess;
   said mold apparatus including guide means for guiding a foil strip carrying chip modules in front of and adjacent said die face.

10. An injection molding apparatus for producing chip cards, the molding apparatus comprising mold wall areas enclosing at least one mold space and at least one die movable between first and second positions within and outside of the mold space, respectively;
   said mold space corresponding virtually to the shape of a chip card without a recess;
   said mold apparatus including a guide means for a foil strip carrying chip modules;
   said die face having a configuration that is variable between a configuration that corresponds with the configuration of a recess to be formed in plastic material injected into the mold space or a configuration that is virtually flat.

11. A method for producing chip cards comprising an injection-molded plastic card body with a recess having a membrane bottom, said recess arranged to receive a chip module, comprising the following steps:
   producing a card body by injecting a molten plastic material into an initial mold space defined by mold wall areas of an injection mold apparatus and whose configuration corresponds substantially to the card body without the recess, the card body having outer dimensions of about 85 mm×54 mm and a thickness of about 0.76 mm;
   reducing the distance between certain wall areas of the initial mold space by advancing a movable die into the mold space to form a recess in the plastic material after the plastic material has flowed at least into the area of the movable die and only after the initial mold space has been filled virtually completely with plastic material so as to leave a membrane bottom of plastic material having a thickness between 80 $\mu$m and 150 $\mu$m, whereby the plastic material in the area of the recess is compressed and/or displaced out of said area, and wherein wall distances defining the initial mold space are increased in certain areas of mold space while the movable die is advanced to reduce the mold space in the area of the recess, the area where the wall distances increase being arranged to receive plastic material displaced out of the mold space in areas that are reduced;
   withdrawing the die from the mold space and removing the card body with the formed recess from the mold space; and
   fastening a chip module in the recess.

12. The method of claim 11 wherein the plastic material is displaced into a gate system for the mold when the die is advanced into the initial mold space.

13. A method for producing chip cards comprising an injection-molded plastic card body with a recess having a membrane bottom, said recess arranged to receive a chip module, comprising the following steps:
   producing a card body by injecting a molten plastic material into an initial mold space defined by mold wall areas of an injection mold apparatus and whose configuration corresponds substantially to the card body without the recess, the card body having outer dimensions of about 85 mm×54 mm and a thickness of about 0.76 mm;
   reducing the distance between certain wall areas of the initial mold space by advancing a movable die into the mold space to form a recess in the plastic material after the plastic material has flowed at least into the area of the movable die so as to leave a membrane bottom of plastic material having a thickness between 80 $\mu$m and 150 $\mu$m, whereby the plastic material in the area of the recess is compressed and/or displaced out of said area;
   withdrawing the die from the mold space and removing the card body with the formed recess from the mold space;
   fastening a chip module in the recess;
   wherein the chip module has a hot-melt adhesive coating, including the step of activating the coating by the residual heat of the molded plastic material after the chip module has been placed in the recess.

* * * * *